(12) United States Patent
LaFontaine et al.

(10) Patent No.: US 8,792,161 B2
(45) Date of Patent: Jul. 29, 2014

(54) OPTICAL POLARIZER WITH NANOTUBE ARRAY

(75) Inventors: Bruno M. LaFontaine, Pleasanton, CA (US); Ryoung-Han Kim, San Jose, CA (US); Harry J. Levinson, Saratoga, CA (US); Uzodinma Okoroanyanwu, Northampton, MA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1839 days.

(21) Appl. No.: 11/709,718

(22) Filed: Feb. 21, 2007

(65) Prior Publication Data

US 2008/0198453 A1 Aug. 21, 2008

(51) Int. Cl.
*G02B 5/30* (2006.01)

(52) U.S. Cl.
CPC ............ *G02B 5/3058* (2013.01); *G02B 5/3075* (2013.01)
USPC ..................................... 359/352; 359/492.01

(58) Field of Classification Search
USPC ..................................... 359/492, 492.01, 352
See application file for complete search history.

(56) References Cited

U.S. PATENT DOCUMENTS

| 3,130,351 | A | * | 4/1964 | Giel | 361/759 |
| 3,161,879 | A | * | 12/1964 | Hannan et al. | 342/5 |
| 3,474,297 | A | * | 10/1969 | Bylander | 361/751 |
| 5,928,817 | A | * | 7/1999 | Yan et al. | 430/5 |
| 6,373,618 | B1 | * | 4/2002 | Agrawal et al. | 359/265 |
| 2002/0046872 | A1 | * | 4/2002 | Smalley et al. | 174/137 A |
| 2004/0047038 | A1 | * | 3/2004 | Jiang et al. | 359/486 |
| 2005/0219696 | A1 | * | 10/2005 | Albert et al. | 359/489 |
| 2006/0121185 | A1 | * | 6/2006 | Xu et al. | 427/163.1 |
| 2006/0284162 | A1 | * | 12/2006 | Kurt et al. | 257/14 |
| 2007/0296897 | A1 | * | 12/2007 | Liu et al. | 349/123 |
| 2008/0318049 | A1 | * | 12/2008 | Hata et al. | 428/408 |

OTHER PUBLICATIONS

Zhao et alia, "Carbon Nanowire Made of a Long Linear Carbon Chain Inserted Inside a Multiwalled Carbon Nanotube," May 6, 2003, Physical Review Letters, vol. 90, No. 18, pp. 187401-1 to 187401-4.*

* cited by examiner

*Primary Examiner* — Derek S Chapel
(74) *Attorney, Agent, or Firm* — Farjami & Farjami LLP

(57) ABSTRACT

An optical polarizer positioned before a light source for use in semiconductor wafer lithography including an array of aligned nanotubes. The array of aligned nanotubes cause light emitted from the light source and incident on the array of aligned nanotubes to be converted into polarized light for use in the semiconductor wafer lithography. The amount of polarization can be controlled by a voltage source coupled to the array of aligned nanotubes. Chromogenic material of a light filtering layer can vary the wavelength of the polarized light transmitted through the array of aligned nanotubes.

15 Claims, 4 Drawing Sheets

OPTICAL POLARIZER WITH NANOTUBE ARRAY

TECHNICAL FIELD

The present invention is generally in the field of semiconductor fabrication. More particularly, the invention is in the field of optical polarizers utilized in semiconductor fabrication.

BACKGROUND ART

During semiconductor wafer fabrication, a lithographic process is typically utilized to transfer a pattern from a mask to the semiconductor wafer. As pattern size continues to decrease in advanced wafer fabrication processes, it becomes more difficult to print a high-contrast image on the semiconductor wafer during lithographic processing. One method of increasing the contrast of the image projected on the wafer utilizes polarized light for illumination in the lithographic process. Polarized light can be provided by utilizing an optical polarizer to polarize incident light that is in an unpolarized, i.e. a randomly polarized, state.

An optical polarizer can provide polarized light by blocking either the transverse electric (TE) or transverse magnetic (TM) component of unpolarized light and allowing the unblocked component to pass through the polarizer. Ideally, the polarized light that is obtained by passing unpolarized through the optical polarizer should include only the unblocked component of the unpolarized light. However, conventional optical polarizers can allow an undesirable percentage of the blocked component of incident unpolarized light to pass through the polarizer, which decreases the quality of the polarized light provided by the polarizer.

SUMMARY

An optical polarizer with nanotube array, substantially as shown in and/or described in connection with at least one of the figures, as set forth more completely in the claims.

DETAILED DESCRIPTION OF THE INVENTION

The present invention is directed to an optical polarizer with nanotube array. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1A:
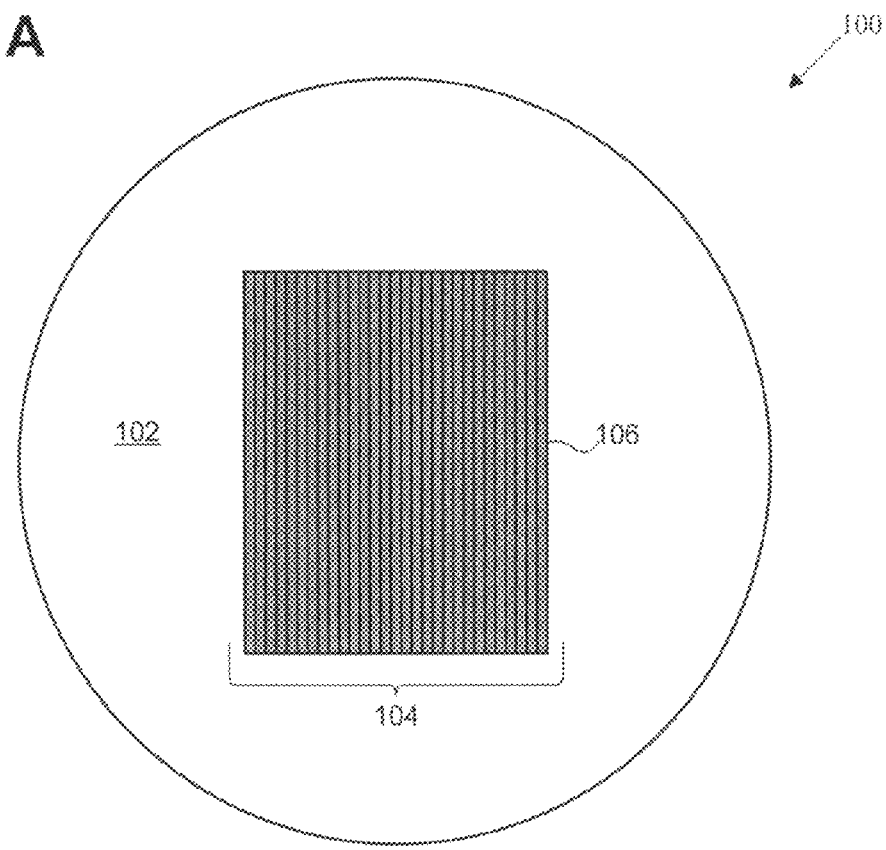
FIG. 1A illustrates a top view of an exemplary optical polarizer in accordance with one embodiment of the present invention.

FIG. 1A shows a top view of optical polarizer 100, according to one embodiment of the present invention. In FIG. 1A, optical polarizer 100 includes substrate 102 and nanotube array 104, which includes nanotubes 106. Optical polarizer 100 can be positioned before a light source to provide polarized light for use in semiconductor wafer lithography during fabrication of a semiconductor die, for example. The light source can be an extreme ultraviolet (EUV) light source, for example. However, optical polarizer 100 can also be utilized in other applications that require polarization of an unpolarized light source.

As shown in FIG. 1A, nanotube array 104 is situated over substrate 102. In another embodiment, nanotube array 104 can be situated over an aperture formed in substrate 102. Nanotube array 104 can comprise a number of nanotubes 106, which are aligned in a parallel configuration. In the present embodiment, nanotubes 106 each comprise a carbon nanotube, which is an allotrope of carbon. Carbon nanotubes can have, for example, a high tensile strength and a high electrical current density. Carbon nanotubes also have a high EUV light transmittance, which allows optical polarizer 100 to be advantageously utilized in EUV lithography. In one embodiment, an array of (aligned) carbon nano-wires may be used, and nanotube array 104 is intended to include, without limitation, various embodiments of carbon nanotubes and carbon nano-wires. Nanotube array 104 can be deposited on or mounted over substrate 102, for example. Substrate 102 can comprise silica, quartz, silicon nitride, or other suitable material, for example. In another embodiment, nanotube array 104 can be mounted over a reflective layer formed on substrate 102. Such a reflective layer can be formed by depositing a layer of gold, silver, aluminum, or other suitable reflective material on substrate 102.

Figure 1B:
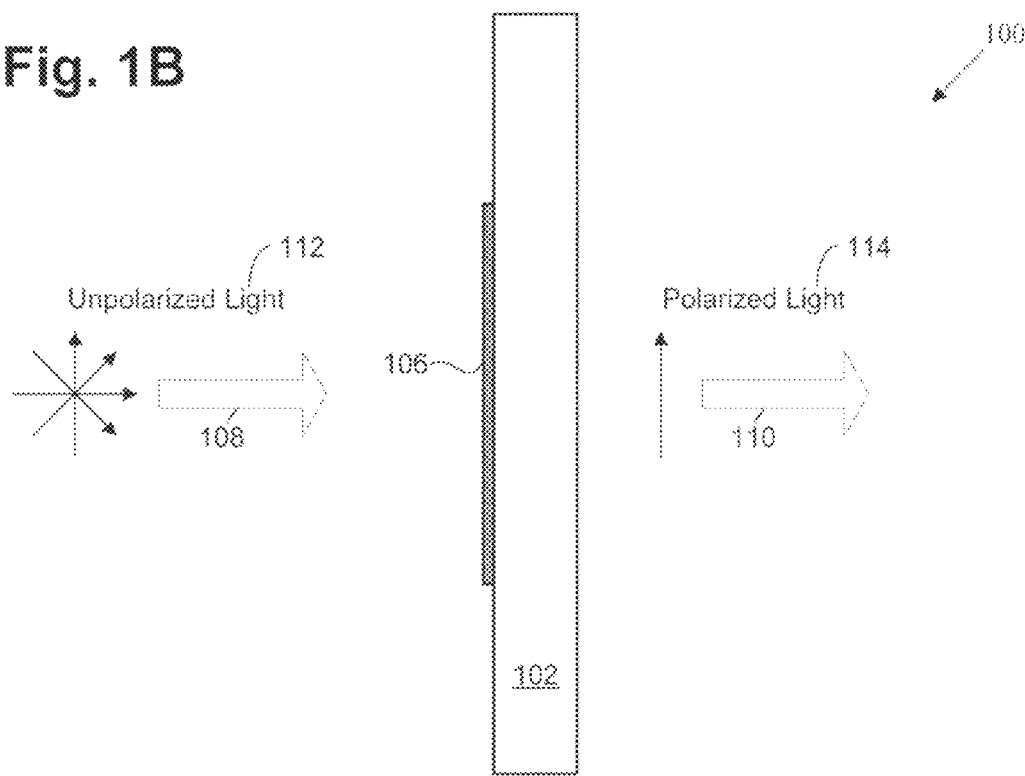
FIG. 1B illustrates a side view of the exemplary optical polarizer in FIG. 1A.

FIG. 1B shows a side view of optical polarizer 100. As shown in FIG. 1B, unpolarized light 112 is incident on the surface of nanotube array 104, as indicated by arrow 108. Unpolarized light 112 can be transmitted from a light source (not shown in FIG. 1B), such as an EUV light source. Also shown in FIG. 1B, polarized light 114 exits optical polarizer 100, as indicated by arrow 110. In optical polarizer 100, the interaction between nanotube array 104 and unpolarized light 112 results in the formation of polarized light 112, which passes through substrate 102 and exits the optical polarizer.

Unpolarized light, such as unpolarized light 112, includes electric field vectors that point in all directions perpendicular to the direction of light propagation. The electric field vectors in unpolarized light can be resolved into two perpendicular components, e.g., TE (transverse electric) and TM (transverse magnetic) components. The respective TE and TM components of unpolarized light are aligned parallel and perpendicular to the plane of light propagation. Linearly polarized light can be achieved by blocking either the TE component or the TM component of unpolarized light.

Polarization of unpolarized light is achieved by optical polarizer 100 as a result of the optical qualities of nanotubes, such as carbon nanotubes. For example, the conductivity of a carbon nanotube in the direction of its length or longitudinal axis is several orders of magnitude greater than the conductivity of the carbon nanotube across its width or latitudinal axis. As a result, the component of incident unpolarized light that is aligned along the longitudinal axis of the carbon nanotube, e.g., the TE component, is transmitted, while the component of incident light that is aligned across its (i.e. the carbon nanotube's) longitudinal axis, e.g., the TM component, is blocked or extinguished. Thus, the longitudinal axis of the carbon nanotube forms a transmission axis for providing polarized light.

Consequently, the component of incident unpolarized light 112 that is aligned along the longitudinal axis, i.e., the transmission axis, of nanotubes 106 is transmitting to form polarized light 114, while the component of unpolarized 112 that is aligned perpendicular to the transmission axis of nanotubes 106 is extinguished. The significant difference in conductivity along the longitudinal and latitudinal axes of nanotubes 106 results in high degree of optical discrimination. As a result, nanotubes 106 can provide polarized light having a high quality by effectively blocking the component of incident unpolarized light that is not aligned along the transmission axis of the nanotubes.

Figure 2:
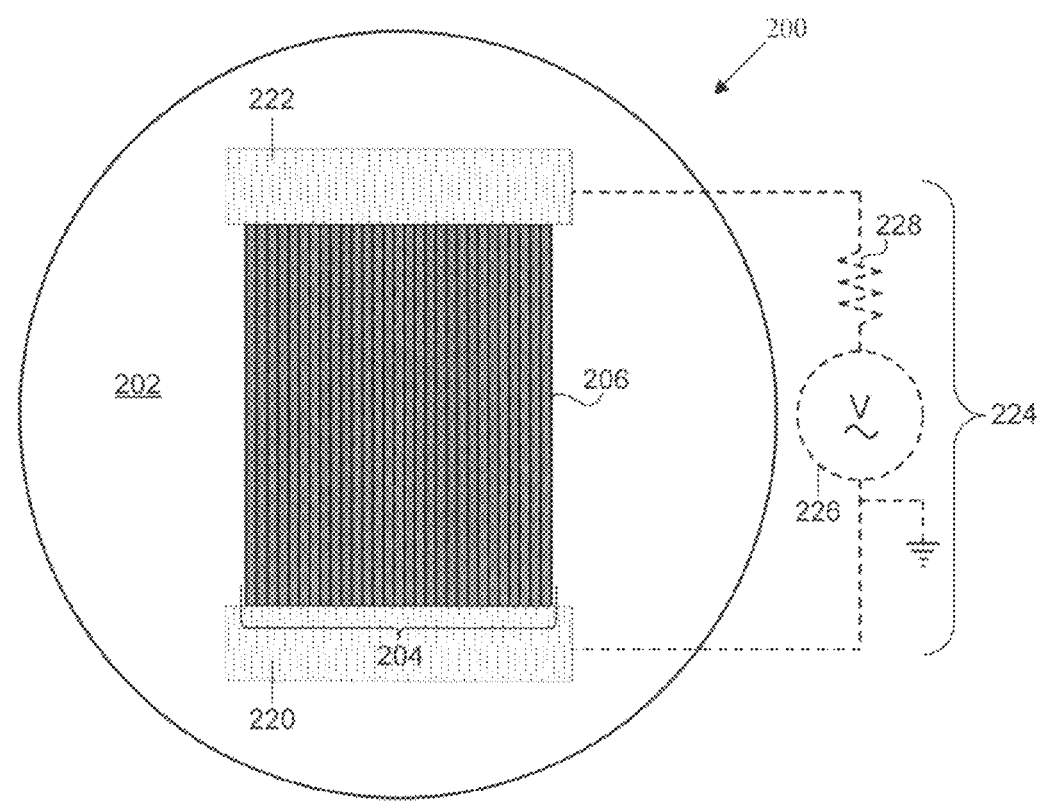
FIG. 2 illustrates a top view of an exemplary optical polarizer coupled to a voltage source in accordance with one embodiment of the present invention.

FIG. 2 shows a top view of optical polarizer 200 coupled to voltage source 226 in circuit 224, according to one embodiment of the present invention. In FIG. 2, nanotube array 204, nanotubes (e.g. carbon nanotubes) 206, and substrate 202 in optical polarizer 200 correspond, respectively, to nanotube array 104, nanotubes 106, and substrate 102 in optical polarizer 100 in FIGS. 1A and 1B. Optical polarizer 200 includes substrate 202, nanotube array 204, nanotubes 206, and electrodes 220 and 222, and circuit 224 includes voltage source 226 and current limiting resistor 228.

Circuit 224 can be coupled to optical polarizer 200 to alter the conductivity of nanotubes 206 in nanotube array 204, thereby controlling the amount of polarization provided by optical polarizer 200. Optical polarizer 200 can provide polarized light having a controllable amount of polarization for use in semiconductor wafer lithography to fabricate a semiconductor die, such as a microprocessor die, for example. However, optical polarizer 200 can also be utilized in other applications where control of the amount of polarization provided by the optical polarizer is desired.

As shown in FIG. 2, electrodes 220 and 222 are situated over substrate 202 and situated in contact with the respective longitudinal ends of nanotube array 204. Electrodes 220 and 222 can each comprise metal, polysilicon, or other suitable conductive material. As also shown in FIG. 2, electrode 222 can be coupled to voltage source 226 via current limiting resistor 228 and electrode 220 can be coupled to ground. Voltage source 226 can be utilized to apply a voltage across the length of nanotubes 206, which alters the longitudinal conductivity of the nanotubes. By varying the longitudinal conductivity, the amount of polarization provided by nanotube array 204 can be correspondingly varied. Thus, by appropriately varying the voltage applied to nanotube array 204, the amount of polarization provided by nanotube array 204 can be correspondingly varied, thereby temporally modulating the polarized light passing through nanotube array 204.

In another embodiment, electrodes 220 and 222 can be appropriately segmented to allow different sections of nanotube array 204 to be selectively coupled to a constant applied voltage via isolated electrode segments. By selectively turning the isolated electrode segments on and off to alter the conductivity of corresponding sections of the nanotube array, portions of the light beam can be selectively polarized to spatially modulate light passing through the array. By varying the voltage applied to the segmented electrodes discussed above, spatially and temporally modulated polarized light can be provided by the nanotube array.

Figure 3:
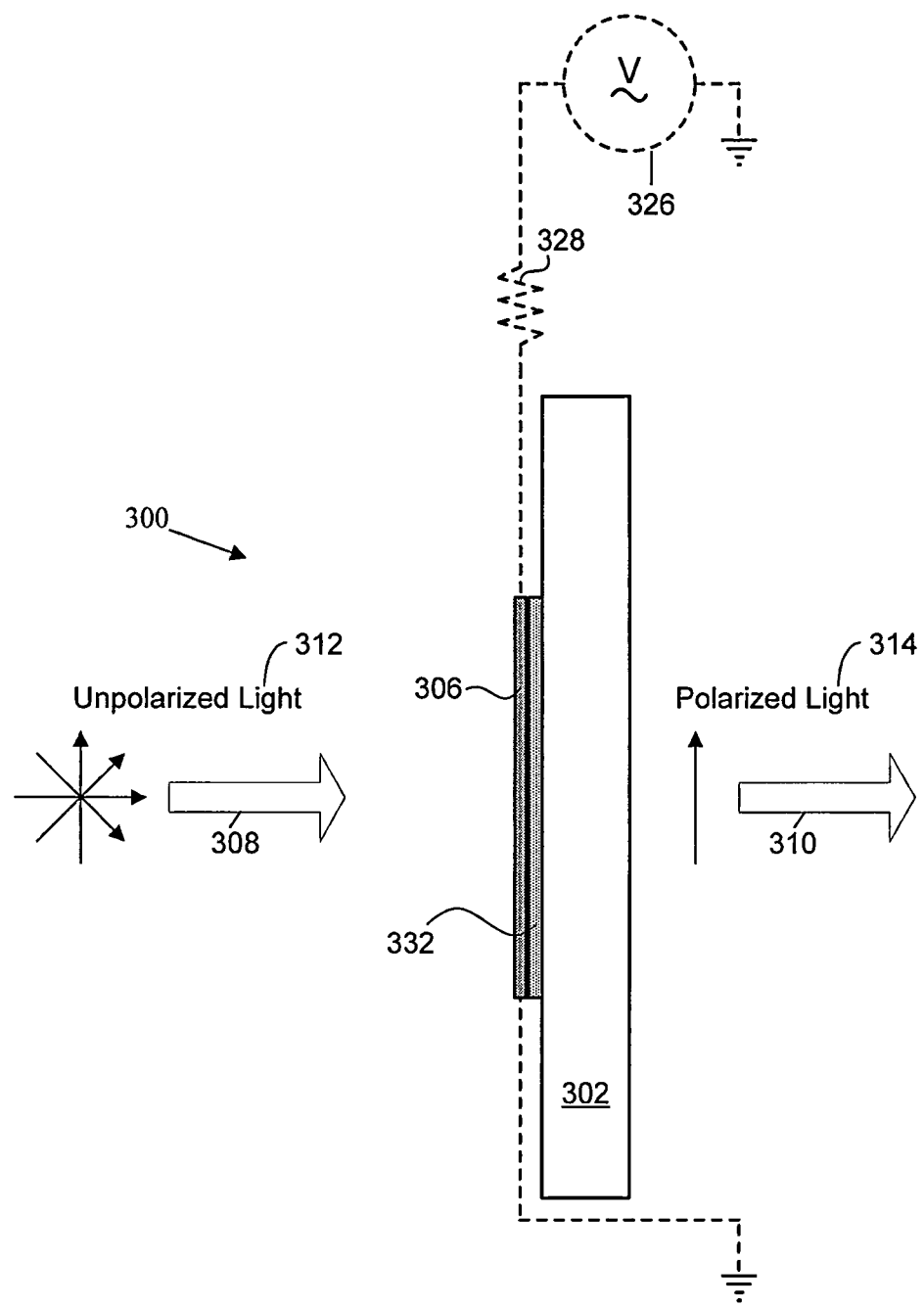
FIG. 3 illustrates a side view of an exemplary optical polarizer coupled to a voltage source in accordance with one embodiment of the present invention.

FIG. 3 shows a side view of optical polarizer 300 coupled to voltage source 326, according to one embodiment of the present invention. In FIG. 3, substrate 302 and nanotubes (e.g. carbon nanotubes) 306 in optical polarizer 300 correspond, respectively, to substrate 202 and nanotubes 206 in optical polarizer 200 in FIG. 2. Also, voltage source 326 and current limiting resistor 328 in FIG. 3 correspond, respectively, to voltage source 226 and resistor 228 in FIG. 2. In FIG. 3, optical polarizer 300 includes substrate 302, nanotubes 306, electrodes 320 and 322, voltage source 326, current limiting resistor 328, and light filtering layer 332. Optical polarizer 300 can provide polarized light having a controllable amount of polarization and a desired wavelength for use in semiconductor wafer lithography to fabricate a semiconductor die, such as a microprocessor die, for example. However, optical polarizer 300 can also be utilized in other applications to provide polarized light having a controlled amount of polarization and a desired wavelength.

As shown in FIG. 3, light filtering layer 332 is situated between nanotubes 306 and substrate 302. In another embodiment, nanotubes 306 can be situated between light filtering layer 332 and substrate 302. Light filtering layer 332 can comprise a layer of chromogenic material, for example (filtering layer 332 is also referred to as chromogenic material 332 in the present application). Voltage source 326 and current limiting resistor 328 are connected across the length of nanotubes 306. As also shown in FIG. 3, unpolarized light 312 is directed to an array of nanotubes 306 as indicated by arrow 308. Interaction between unpolarized light 312, nanotubes 306, and light filtering layer 332 provides polarized light 314, which passes through substrate 302, as indicated by arrow 310. Unpolarized light 312 can be EUV light, for example.

Voltage source 326 can be utilized to apply a voltage across the longitudinal axes of nanotubes 306 so as to control the amount of polarization of the polarized light provided by nanotubes 306, as discussed above in the embodiment in FIG. 2. Additionally, the voltage applied to nanotubes 306 can be utilized to control the optical properties of light filtering layer 332, which is in contact with nanotubes 306 and which can comprise a chromogenic material. For example, by appropriately controlling the voltage applied to nanotubes 306, the wavelength selectivity of light filtering layer 332 can be controlled, thereby controlling the wavelength of the polarized light provided by nanotubes 306. In another embodiment, an alternating voltage can be applied to nanotubes 306 so as to modulate the optical response of light filtering layer 332 in relation to the frequency of the alternating voltage.

Thus, in the embodiment in FIG. 3, by applying a voltage to a nanotube array and providing a light filtering layer, such as a layer of chromogenic material, in contact with the nanotube array, the invention achieves an optical polarizer that can advantageously provide polarized light with a controlled amount of polarization and a controlled wavelength.

Figure 4:
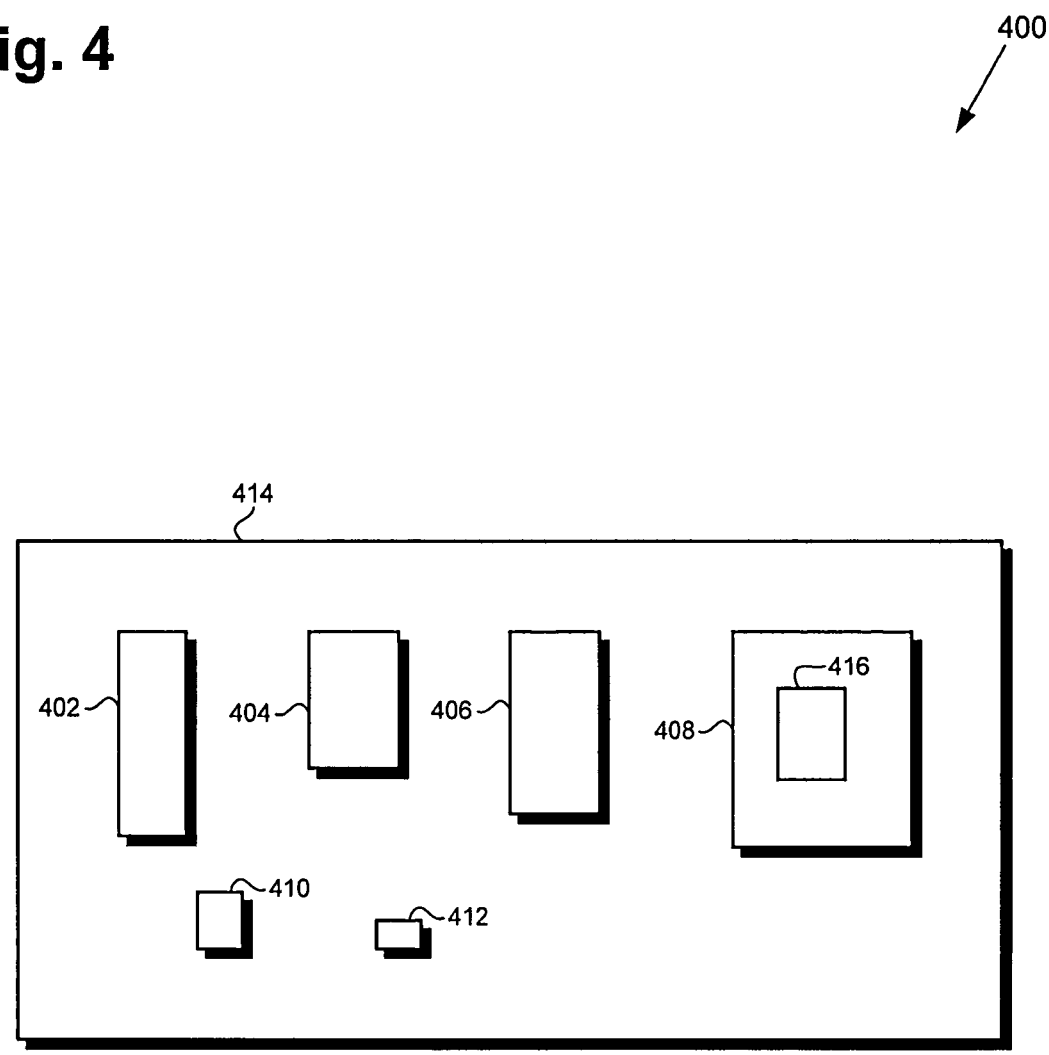
FIG. 4 illustrates a diagram of an exemplary electronic system including an exemplary IC chip or semiconductor die fabricated by utilizing an optical polarizer in a lithographic process in accordance with one embodiment of the present invention.

FIG. 4 illustrates a diagram of an exemplary electronic system including an exemplary chip or die fabricated by utilizing an optical polarizer in a lithographic process in accordance with one embodiment of the present invention. Electronic system 400 includes exemplary modules 402, 404, and 406, IC chip 408 (also referred to as semiconductor die 408 in the present application), discrete components 410 and 412, residing in and interconnected through circuit board 414. In one embodiment, electronic system 400 may include more than one circuit board. IC chip 408 can comprise a semiconductor die that is fabricated by using an embodiment of the invention's optical polarizer, such as optical polarizer 100 in FIG. 1, to provide polarized light for semiconductor wafer lithography. IC chip 408 includes circuit 416, which can be a microprocessor, for example.

As shown in FIG. 4, modules 402, 404, and 406 are mounted on circuit board 414 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electro-mechanical motor control module, or a field programmable gate array (FPGA), or any other kind of module utilized in modern electronic circuit boards. Circuit board 414 can include a number of interconnect traces (not shown in FIG. 4) for interconnecting modules 402, 404, and 406, discrete components 410 and 412, and IC chip 408.

Also shown in FIG. 4, IC chip 408 is mounted on circuit board 414 and can comprise, for example, any semiconductor die that is fabricated by utilizing an embodiment of the invention's optical polarizer. In one embodiment, IC chip 408 may not be mounted on circuit board 414, and may be interconnected with other modules on different circuit boards. Further shown in FIG. 4, discrete components 410 and 412 are mounted on circuit board 414 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor.

Electronic system 400 can be utilized in, for example, a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, or a digitally-controlled medical equipment, or in any other kind of system, device, component or module utilized in modern electronics applications.

Thus, in the embodiment in FIGS. 1A and 1B discussed above, by utilizing an array of nanotubes, such as carbon nanotubes, the present invention achieves an optical polarizer capable of providing a high degree of optical discrimination. As a result, the invention's optical polarizer more effectively extinguishes an unwanted component in unpolarized light, thereby advantageously providing a higher quality of polarized light. Also, in the embodiment in FIG. 2, by applying a voltage to the array of nanotubes, the invention achieves an optical polarizer that can provide polarized light with a controlled amount of polarization. Additionally, in the embodiment in FIG. 3, by applying a voltage to an array of nanotubes in an optical polarizer that includes a light filtering layer, such as a layer of chromogenic material, the invention achieves an optical polarizer that can provide polarized light with a controlled amount of polarization and a controlled wavelength.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, an optical polarizer with nanotube array has been described.

The invention claimed is:

1. An optical polarizer positioned before a light source, said optical polarizer comprising:
an array of nanotubes;
said array of nanotubes causing light emitted from said light source and incident on said array of nanotubes to be converted into polarized light;
said optical polarizer being suitable for implementation as an extreme ultraviolet (EUV) light polarizer for use in EUV semiconductor wafer lithography.

2. The optical polarizer of claim 1, wherein said optical polarizer is utilized to fabricate a semiconductor die.

3. The optical polarizer of claim 2, where said semiconductor die is utilized in a circuit board.

4. The optical polarizer of claim 2, wherein said semiconductor die is utilized in a circuit board as a part of an electronic system, said electronic system being selected from the group consisting of a wired communications device, a wireless communications device, a cell phone, a switching device, a router, a repeater, a codec, a LAN, a WLAN, a digital camera, a digital audio player, a digital audio recorder, a digital video player, a digital video recorder, a computer, a monitor, a television set, a satellite set top box, a cable modem, a digital automotive control system, a digitally-controlled home appliance, a printer, a copier, a digital audio receiver, a digital video receiver, an RF transceiver, a personal digital assistant (PDA), digital game playing device, a digital testing device, a digital measuring device, a digital avionics device, a medical device, and a digitally-controlled medical equipment.

5. The optical polarizer of claim 1, wherein said array of nanotubes comprises aligned carbon nanotubes.

6. The optical polarizer of claim 1, wherein said array of nanotubes comprises aligned carbon nano-wires.

7. The optical polarizer of claim 1 further comprising a substrate, wherein said array of nanotubes are situated over said substrate.

8. The optical polarizer of claim 7, wherein said array of nanotubes are situated over an aperture in said substrate.

9. The optical polarizer of claim 1, wherein said light source is an extreme ultraviolet (EUV) light source.

10. An optical polarizer positioned before a light source for use in extreme ultraviolet (EUV) semiconductor wafer lithography, said optical polarizer comprising:
an array of aligned carbon nanotubes formed over a substrate; and
a voltage source coupled to said array of aligned carbon nanotubes;
said array of aligned carbon nanotubes causing light emitted from said light source and incident on said array of aligned carbon nanotubes to be converted into polarized light with a desired amount of polarization for use in said (EUV) semiconductor wafer lithography, and said voltage source determining said desired amount of polarization.

11. The optical polarizer of claim 10, wherein said optical polarizer is utilized to fabricate a semiconductor die.

12. The optical polarizer of claim 11, where said semiconductor die is utilized in a circuit hoard.

13. The optical polarizer of claim 11, wherein said semiconductor die is utilized in a circuit board as a part of an electronic system, said electronic system being selected from the group consisting of a wired communications device, a wireless communications device, a cell phone, a switching device, a router, a repeater, a codec, a LAN, a WLAN, a digital camera, a digital audio player, a digital audio recorder, a digital video player, a digital video recorder, a computer, a monitor, a television set, a satellite set top box, a cable modem, a digital automotive control system, a digitally-controlled home appliance, a printer, a copier, a digital audio receiver, a digital video receiver, an RF transceiver, a personal digital assistant (PDA), digital game playing device, a digital testing device, a digital measuring device, a digital avionics device, a medical device, and a digitally-controlled medical equipment.

14. The optical polarizer of claim 10 further comprising a layer of chromogenic material underlying said array of aligned carbon nanotubes.

15. The optical. polarizer of claim 10, wherein said light source is an EUV light source.

* * * * *